(12) United States Patent
Wu et al.

(10) Patent No.: US 9,490,174 B2
(45) Date of Patent: Nov. 8, 2016

(54) FABRICATING RAISED FINS USING ANCILLARY FIN STRUCTURES

(71) Applicant: GLOBALFOUNDRIES Inc., Grand Cayman (KY)

(72) Inventors: Xusheng Wu, Ballston Lake, NY (US); Jianwei Peng, Ballston Spa, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 169 days.

(21) Appl. No.: 14/279,480

(22) Filed: May 16, 2014

(65) Prior Publication Data

US 2015/0332972 A1 Nov. 19, 2015

(51) Int. Cl.
*H01L 21/8234* (2006.01)
*H01L 21/02* (2006.01)

(52) U.S. Cl.
CPC . *H01L 21/823431* (2013.01); *H01L 21/02521* (2013.01); *H01L 21/02529* (2013.01); *H01L 21/02532* (2013.01); *H01L 21/02538* (2013.01); *H01L 21/823437* (2013.01); *H01L 21/823475* (2013.01)

(58) Field of Classification Search
CPC ........... H01L 29/785; H01L 29/66795; H01L 21/823431; H01L 21/845
See application file for complete search history.

(56) References Cited

U.S. PATENT DOCUMENTS

| | | | | |
|---|---|---|---|---|
| 9,059,001 B2* | 6/2015 | Liu | .................. | H01L 29/66795 |
| 9,147,765 B2* | 9/2015 | Xie | ...................... | H01L 29/785 |
| 2005/0285186 A1* | 12/2005 | Fujiwara | ............... | H01L 29/785 257/327 |
| 2006/0157749 A1* | 7/2006 | Okuno | ............. | H01L 29/41791 257/288 |
| 2006/0292781 A1* | 12/2006 | Lee | ................... | H01L 21/28282 438/197 |
| 2009/0026505 A1* | 1/2009 | Okano | ............. | H01L 29/66795 257/255 |
| 2013/0181184 A1* | 7/2013 | Sakuma | .......... | H01L 21/823431 257/5 |
| 2014/0367780 A1* | 12/2014 | Hong | .................... | H01L 29/785 257/347 |
| 2015/0035568 A1* | 2/2015 | Peng | ..................... | H01L 27/088 327/109 |

\* cited by examiner

*Primary Examiner* — Zandra Smith
*Assistant Examiner* — John M Parker
(74) *Attorney, Agent, or Firm* — Heslin Rothenberg Farley & Mesiti P.C.; Nicholas Mesiti (57) ABSTRACT

A method of fabricating a raised fin structure including a raised contact structure is provided. The method may include: providing a base fin structure; providing at least one ancillary fin structure, the at least one ancillary fin structure contacting the base fin structure at a side of the base fin structure; growing a material over the base fin structure to form the raised fin structure; and, growing the material over the at least one ancillary fin structure, wherein the at least one ancillary fin structure contacting the base fin structure increases a volume of material grown over the base fin structure near the contact between the base fin structure and the at least one ancillary fin structure to form the raised contact structure.

19 Claims, 8 Drawing Sheets

FABRICATING RAISED FINS USING ANCILLARY FIN STRUCTURES

FIELD OF THE INVENTION

The present invention generally relates to facilitating fabricating circuit structures of an integrated circuit, and more specifically, to methods of forming fin structures of a circuit structure.

BACKGROUND

Circuit structure fabrication, such as semiconductor device fabrication, may include fabricating fin structures and/or gate structures of fin-type field-effect transistors (FinFETs), or fabricating field-effect transistors (FETs) in general. As the size of technology nodes continues to decrease, challenges in forming fin structures of a designed size and shape may arise due, in part, to limitations of available processes for forming fin structures and raised fin structures, which may result in undesirable properties of the circuit structure, such as increased parasitic capacitances and increased parasitic resistances within a completed circuit structure.

SUMMARY OF THE INVENTION

The shortcomings of the prior art are overcome and additional advantages are provided through the provision, in one aspect, of a method of fabricating a raised fin structure, the raised fin structure including a raised contact structure, the method including: providing a base fin structure; providing at least one ancillary fin structure, the at least one ancillary fin structure contacting the base fin structure at a side of the base fin structure; growing a material over the base fin structure to form the raised fin structure; and, growing the material over the at least one ancillary fin structure, wherein the at least one ancillary fin structure contacting the base fin structure increases a volume of material grown over the base fin structure near the contact between the base fin structure and the at least one ancillary fin structure to form the raised contact structure.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
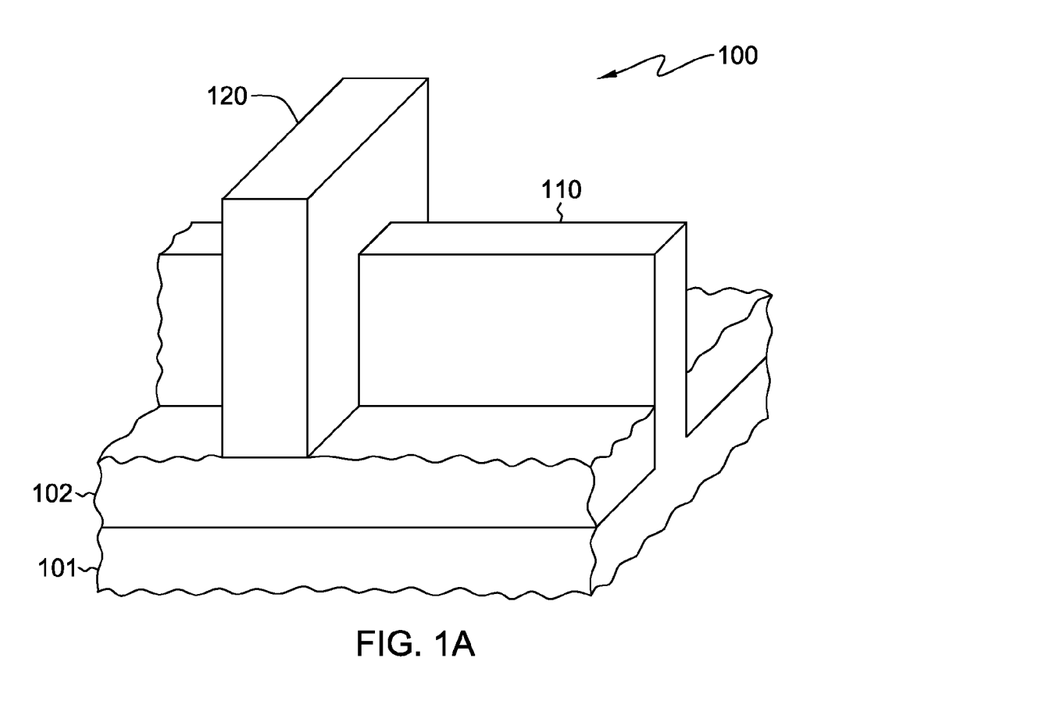
FIGS. 1A-1C depict one embodiment of a process for forming a raised fin structure, highlighting issues which are to be addressed by one or more aspects of the present invention.

FIG. 1A illustrates one embodiment of a portion of a circuit structure 100 that includes a base layer or substrate 101, such as a semiconductor substrate or layer, an oxide layer 102 over base layer 101, and a base fin structure 110. The portion of circuit structure 100 depicted also may include at least one gate structure 120 extending transversely over base fin structure 110. Base fin structure 110 may be an elongated structure, as depicted by FIG. 1A. It may be understood that base fin structure 110 and gate structure 120 may extend further than depicted; however, base fin structure 110 and gate structures 120 are depicted as in FIG. 1A, and in subsequent figures, by way of illustration only so as not to overly complicate the figures, and for ease in understanding the figures and methods disclosed herein. Base fin structure 110 may be provided by various processes and may be, for example, a silicon base fin structure. Base fin structure 110 may, by way of example, be formed of the same material as base layer 101, as illustrated in FIG. 1A. Gate structure 120 may also be provided by various processes.

Base fin structure 110 in FIG. 1A may lack one or more properties desired for a completed circuit structure. For example, in some circuit structures it may be desirable to form fin structures that allow for increased carrier mobility through the fins, which may be achieved, for example, by forming fin structures with induced strain or with a dopant material; a base fin structure 110 formed of silicon may lack such increased carrier mobility. In another example, fin structures may be designed to serve as a source/drain of a FinFET transistor; the height of base fin structure 110 may not be the designed height for such a source/drain. In yet another example, the size or shape of base fin structure 110 may be sub-optimal for achieving minimized resistance in a completed circuit structure. Resolving such issues may include recessing base fin structure 110, at least in part, and growing a material over the recessed base fin structure to form a raised fin structure.

Figure 1B:
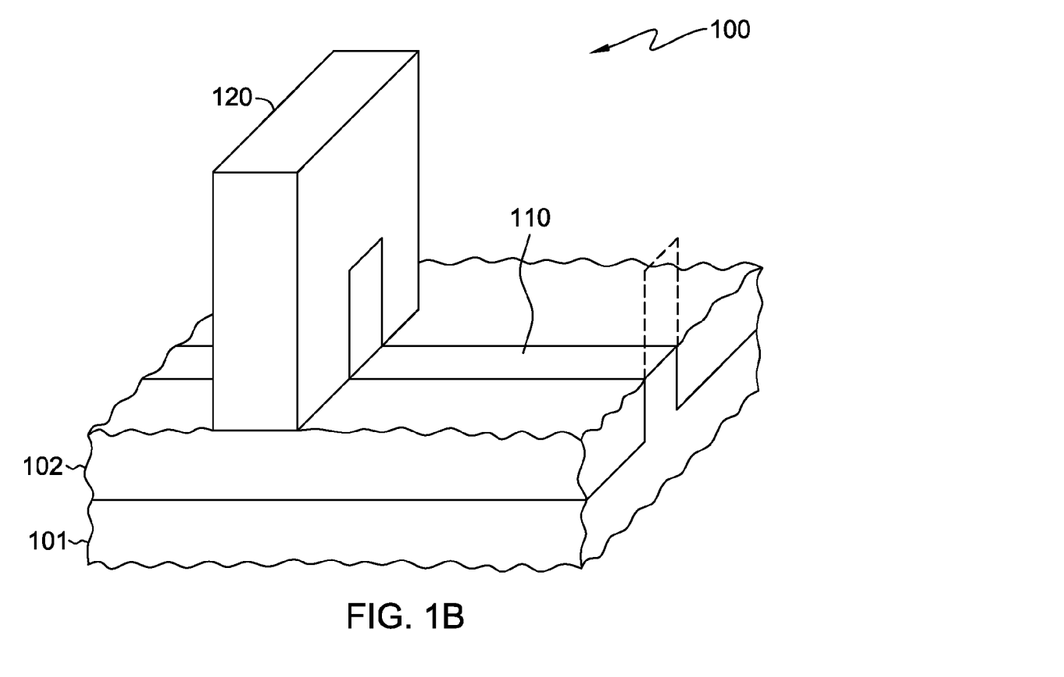
Figure 1C:
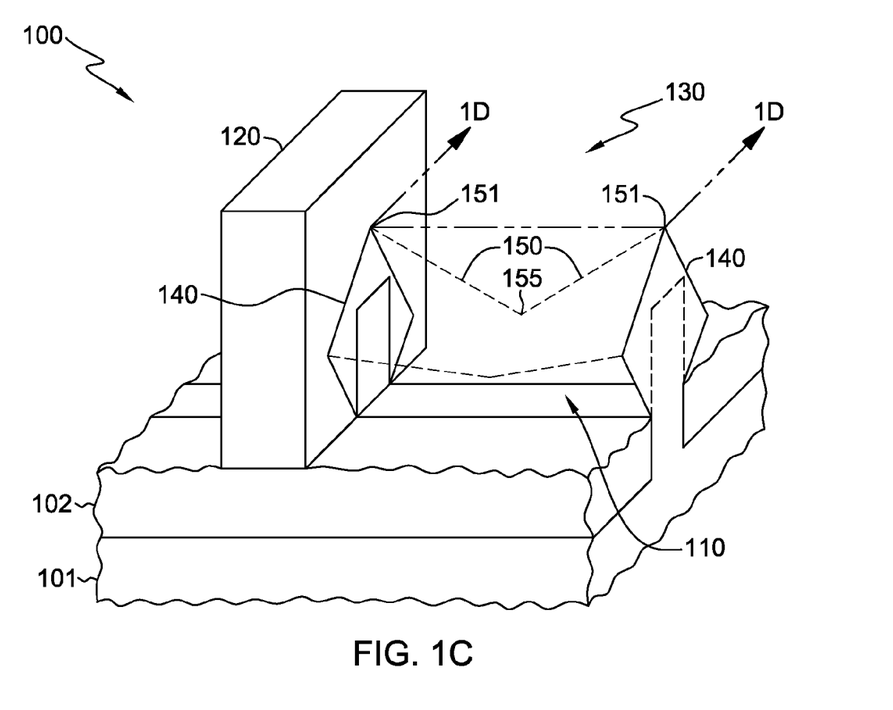

One example of a process for forming a raised fin structure is illustrated in FIGS. 1B-1C. FIG. 1B depicts base fin structure 110 of FIG. 1A following recession of base fin structure 110 to the level of oxide layer 102, forming the recessed base fin structure 110 depicted. A portion of base fin structure 110 may be protected from recession by at least one gate structure 120. In another example, base fin structure 110 may be recessed without recessing to the level of oxide layer 102. In another example, base fin structure 110 may not be recessed, and the base fin structure 110 of FIG. 1A may serve as a base fin structure for growing a raised fin structure as described below. FIG. 1C depicts a raised fin structure 130 formed over base fin structure 110 through growth of a material over recessed base fin structure 110. The growing may, for example, include epitaxially growing a crystalline material, such as silicon-germanium (SiGe) or silicon with in-situ doping of phosphorous (SiP) or boron (SiB), over base fin structure 110. The growing may, as in the example illustrated, result in a raised fin structure 130 with a diamond-shaped transverse cross-section. This may occur, in part, due to the nature of the growth process. For example, epitaxial growth of a crystalline material, such as silicon-germanium, may tend to grow faster over upper surfaces and side surfaces of base fin structure 110 and slower over other crystalline surfaces of base fin structure 110. In other examples, the growing may result in a raised fin structure 130 with a different transverse cross-section shape, such as a diamond-shape with a rounded or flattened upper surface.

Growing material over base fin structure 110, for example as described above, may result in a raised fin structure 130 with certain undesirable characteristics. For example, the height of raised fin structure 130 as measured at an upper surface 150 of raised fin structure 130 may vary along the length of the raised fin structure 130, and the height 151 near gate structures 120 may be much greater than at the center 155 of raised fin structure 130. Such a difference in heights may be due in part to the nature of the growth process itself. For example, as described above, epitaxial growth of a crystalline material may form a raised fin structure 130 with a diamond-shaped or nearly diamond-shaped transverse cross-section profile. The diamond-shape may completely form more quickly near gate structures 120 from base fin structure 110 than near the center 155 of base fin structure 155, due to both the recessed and non-recessed portions of base fin structure 110 supporting epitaxial material growth near gate structure 120. The diamond-shape near center 155 may form before the raised fin structure 130 reaches a desired minimum height H near the center 155. Thus, the rate of continued growth near center 155 up to the desired minimum height may decrease, requiring the growth process to run for a greater time T to achieve the desired minimum height H at the center 155, while growth closer to gate structures 120 may continue without a similar decrease in growth rate.

The growth of raised fin structure 130 to height 151 near gate structures 120 may further result in a contact interface 140 between raised fin structure 130 and gate structure 120 with a surface area that may increase a parasitic capacitance between gate structure 120 and raised fin structure 130. Parasitic capacitance in a circuit structure may allow undesirable current leakage and energy loss within the circuit structure, thus a large contact interface 140 between gate structure 120 and raised fin structure 130 may lead to increased energy losses in the circuit structure. Minimizing the size of contact interface 140 may thus be desirable, but may not be achievable where the growth process must run for some time T to allow raised fin structure 130 to reach a minimum height H at center 155.

Figure 1D:
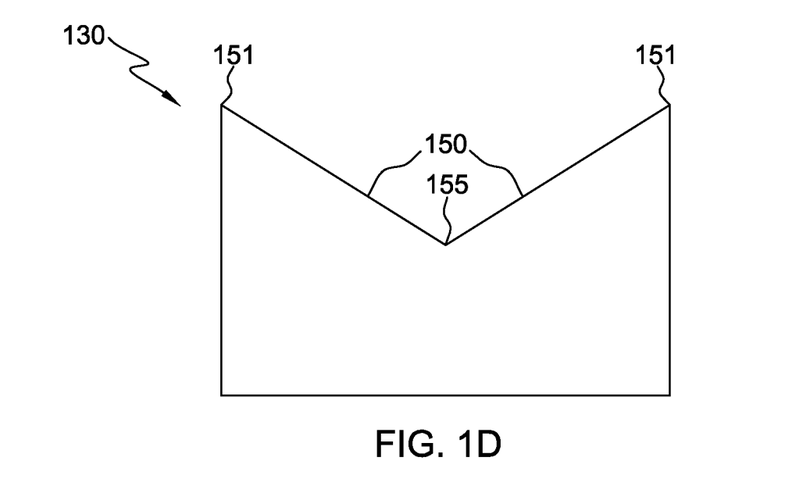
FIGS. 1D-1E depict one embodiment of a cross-sectional profile of a raised fin structure that may be formed by the process depicted in FIGS. 1A-1C, further highlighting issues which are to be addressed by one or more aspects of the present invention.
Figure 1E:
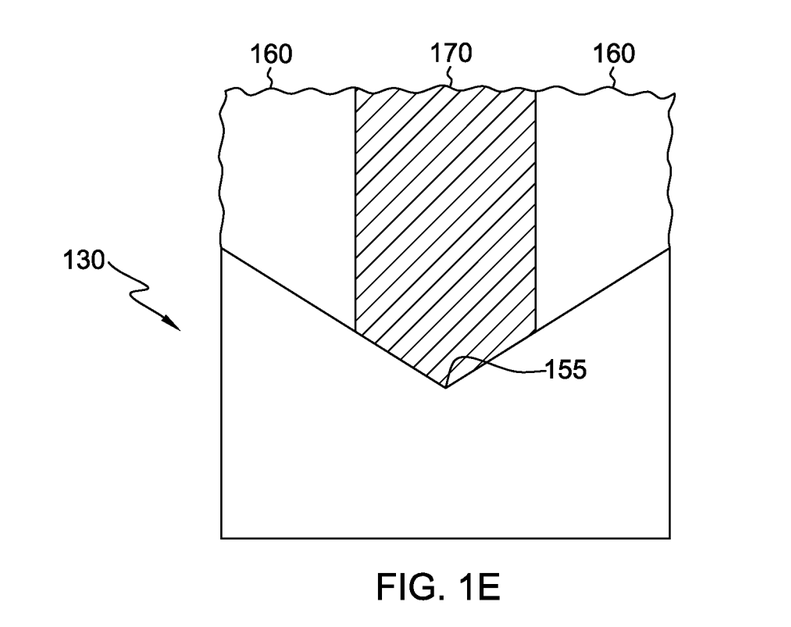

Parasitic capacitance may not be the only issue resulting from forming a raised fin structure as depicted in FIG. 1C. FIG. 1D depicts one embodiment of a portion of raised fin structure 130 of FIG. 1C in cross-section profile along the length of raised fin structure 130, illustrating generally the varying height of the upper surface 150 of raised fin structure 130 that may be formed by processes described above. Raised fin structure 130 may be further processed, for example through a silicidation process, to form a conductive contact 170 between raised fin structure 130 and another circuit structure layer, such as a metal layer. FIG. 1E illustrates one example embodiment of a process resulting in a conductive contact 170 being formed in contact with raised fin structure 130 near center 155. A silicidation process, for example, may provide an oxide material 160 over raised fin structure 130, followed by an etching process in which a portion of oxide material 160 is removed from over the center 155 of raised fin structure 130, resulting in a trench over center 155. The trench may then be filled with a conductive material, such as a silicide material (for example, titanium-silicide) to form the conductive contact 170. The quality of the contact may depend on a size of the surface area of a contact interface between raised fin structure 130 and conductive contact 170, as a greater contact interface surface area reduces parasitic resistance and increases current flow between conductive contact 170 and raised fin structure 130. The conductive contact 170 depicted in FIG. 1E may depict a result of an ideal silicidation process in which the etching process etches through oxide material 160 completely to center 155 of raised fin structure 130. In practice, however, an etching process may leave some portion of oxide material 160 remaining over center 155. This may be caused, in part, by the convex-shape of the cross-section of raised fin structure 130, as depicted by FIG. 1E; the etch process may not fully etch to the bottom point of center 155, and/or residue oxide material may be left near center 155. Conductive contact 170 may, as a result, fail to contact raised fin structure 130 over the center 155, resulting in a reduced contact interface surface area and consequently increasing parasitic resistance between raised fin structure 130 and conductive contact 170. Poor contact and increased parasitic resistance in a circuit structure may result in circuit structure failures, losses and waste in electrical energy, and other performance losses in the circuit structure.

Thus, provided herein, in one aspect, is a method of fabricating a raised fin structure, the raised fin structure including a raised contact structure, the method including: providing a base fin structure; providing at least one ancillary fin structure, the at least one ancillary fin structure contacting the base fin structure at a side of the base fin structure; growing a material over the base fin structure to form the raised fin structure; and, growing the material over the at least one ancillary fin structure, wherein the at least one ancillary fin structure contacting the base fin structure increases a volume of material grown over the base fin structure near the contact between the base fin structure and the at least one ancillary fin structure to form the raised contact structure. In one embodiment, the raised contact structure may facilitate increasing a surface area of a contact interface between the raised contact structure and a conductive contact structure formed over the raised fin structure. In another embodiment, the formation of the raised contact structure may minimize a time T of the growth of the material over the base fin structure, which may further reduce a surface area of a contact interface between the raised fin structure and at least one gate structure.

Figure 2A:
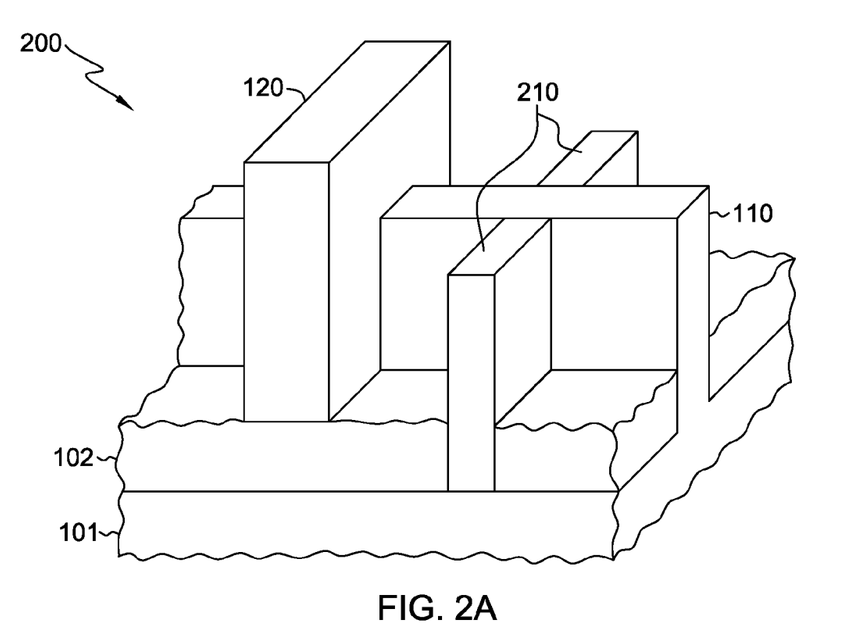
FIGS. 2A-2C illustrate one embodiment of a process using at least one ancillary fin structure for forming a raised fin structure including a raised contact structure that may overcome one or more issues illustrated in FIGS. 1A-1E, in accordance with one or more aspects of the present invention.
Figure 2B:
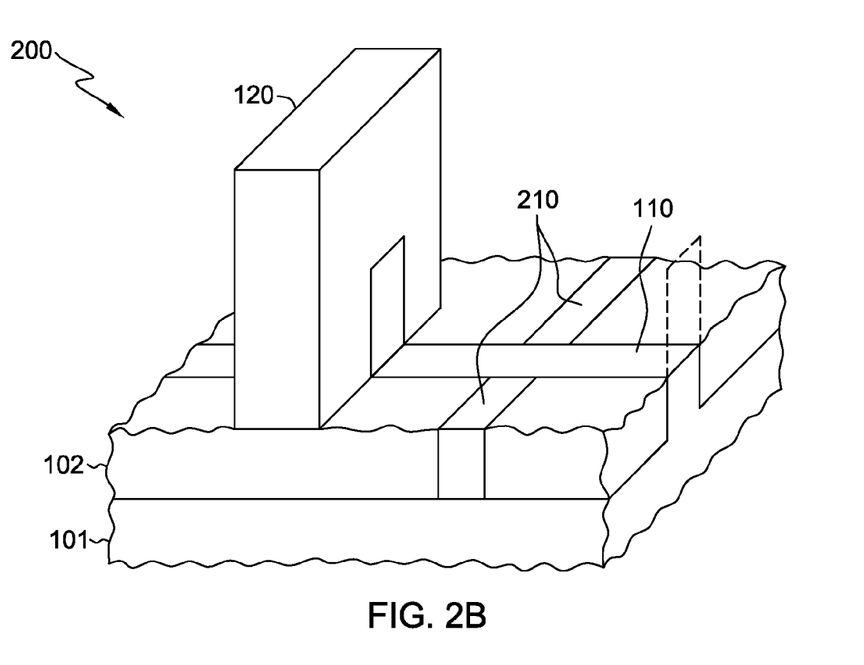
Figure 2C:
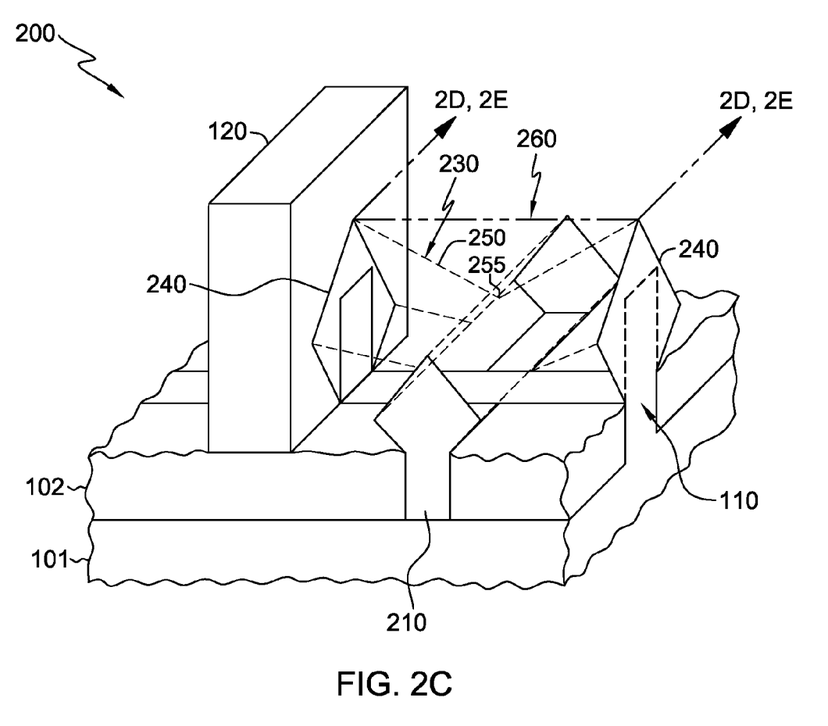

FIGS. 2A-2C illustrate an embodiment of a portion of a circuit structure 200 including at least one ancillary fin structure 210 disposed and configured to facilitate fabricating a raised fin structure that includes a raised contact structure. FIG. 2A depicts circuit structure 200 as including a base fin structure 110 and at least one gate structure 120 extending transversely over base fin structure 110. At least one ancillary fin structure 210 is also provided, the at least one ancillary fin structure contacting the base fin structure at a side of the base fin structure. In one embodiment, the base fin structure 110 may be made of a base material and the at least one ancillary fin structure 210 may be made of the same base material. Base fin structure 110 and at least one ancillary fin structure 210 may be provided at the same time or by the same process, for example if both are made of the same base material. In another embodiment, base fin structure 110 may be made of a first base material and the at least one ancillary fin structure 210 may be made of a second material different from the first base material. Base fin structure 110 and at least one ancillary fin structure 210 may be formed by similar or separate processes if the first base material and second base material are different materials. In one exemplary embodiment, the at least one ancillary fin structure 210 may perpendicularly contact the base fin structure 110.

In another exemplary embodiment, the at least one gate structure may be a first gate structure, a second gate structure 120 may also extend transversely over base fin structure 110, and the at least one ancillary fin structure 210 may contact base fin structure 110 intermediate the first gate structure 120 and the second gate structure 120. The at least one ancillary fin structure 210 may, in alternative embodiments, contact a side of base fin structure 110 anywhere in relation to a first gate structure or second gate structure; however, as illustrated in part by FIG. 1C, the volume of material grown over base fin structure 110 may be largest near gate structures 120 and lowest near center 155 of base fin structure 110, at a point intermediate the gate structures 120, thus the at least one ancillary fin structure 210 may advantageously contact a side of base fin structure 110 intermediate gate structure 120. In yet another exemplary embodiment, the at least one ancillary fin structure 210 may be a first ancillary fin structure 210 that contacts base fin structure 110 at a first side of base fin structure 110, and a second ancillary fin structure 210 may also be provided to contact base fin structure 110 at a second side of base fin structure 110, the second side being opposite to the first side. In one example, first ancillary fin structure 210 and second ancillary fin structure 210 may be separated by base fin structure 110. The at least one ancillary fin structure 210 need not be the same width as base fin structure 110, as design rules for circuit structure 200 may impose different size or pitch restrictions on a base fin structure 110, oriented in a particular direction, versus an ancillary fin structure 210 oriented transversely or perpendicularly to base fin structure 110.

FIG. 2B depicts the circuit structure 200 of FIG. 2A following a process in which base fin structure 110 and at least one ancillary fin structure 210 have been recessed. In the example embodiment illustrated FIG. 2A, base fin structure 110 and at least ancillary fin structure 210 may be recessed to about the level of oxide layer 102. In another example, base fin structure 110 and at least one ancillary fin structure 210 may be recessed without recessing to the level of oxide layer 102. In another example, base fin structure 110 and at least one ancillary fin structure 210 may not be recessed, and the base fin structure 110 and at least one ancillary fin structure 210 of FIG. 2A may serve as a base fin structure and ancillary fin structure for growing a raised fin structure including a raised contact structure, as described below. In yet another example, base fin structure 110 and at least one ancillary fin structure 210 may be recessed in separate processes, and may be recessed to different heights, such as in embodiments in which base fin structure 110 is made of a first base material and at least one ancillary fin structure 210 is made of a second base material different from the first base material.

FIG. 2C depicts the circuit structure 200 of FIG. 2B following growth of a material over base fin structure 110 and the at least one ancillary fin structure 210. The material provided may, in one example, include one or more of silicon-phosphorous (SiP), silicon-boron (SiB), silicon carbide (SiC), or silicon-germanium (SiGe). In another example the material provided may include a column III-V material, where III and V refer to columns of elements on the periodic table. An exemplary column III-V material may be, in one instance, gallium arsenide (GaAs). Growing the material over base fin structure 110, depicted by dashed line 250, may form raised fin structure 230, similar to the raised fin structure of FIG. 1C. Growing the material over at least one ancillary fin structure 210 may increase the volume of material grown over the base fin structure 110 near the contact between the base fin structure and the at least one ancillary fin structure, forming raised contact structure 260 on base fin structure 110 near the contact between base fin structure 110 and at least one ancillary fin structure 210. In exemplary embodiments in which the at least one gate structure is a first gate structure 120 and a second gate structure 120 is also disposed transversely over base fin structure 110 (near the dashed portion of base fin structure 110), and in which at least one ancillary fin structure 210 contacts a side of base fin structure 110 intermediate the first and second gate structures 120, raised contact structure 260 may be formed at or near center 255 of raised fin structure 230, as illustrated in FIG. 2C and also illustrated in FIGS. 2D and 2E. In one exemplary embodiment, raised contact structure 260 formed on raised fin structure 230 may have an upper surface that has a convex shape. For instance, the convex shape of the upper surface of raised contact structure 260 may be a pyramid shape. It may be understood that different convex shapes of the upper surface of raised contact structure may alternatively result according to the methods disclosed herein.

In one example, growing the material over base fin structure 110 and at least one ancillary fin structure 210 may include an epitaxial growth process. Epitaxial growth processes, as described above, may grow a greater volume of material over larger surfaces and more slowly over smaller surfaces. Similarly as described above, an epitaxial growth process over at least one ancillary fin structure 210 may result in a diamond-shaped structure being formed over at least one ancillary fin structure 210, as illustrated by FIG. 2C. As the at least one ancillary fin structure 210 provides additional structure and surface over which material may be grown, in addition to base fin structure 110, the at least one ancillary fin structure 210 contacting base fin structure 110 may increase the volume of material epitaxially grown near the contact between base fin structure 110 and at least one ancillary fin structure 210. The combined volume of material grown over base fin structure 110 and at least one ancillary fin structure 210 may thus form raised contact structure 260 on raised fin structure 230.

In another example, the at least one ancillary fin structure 210 may be a first ancillary structure contacting base fin structure 110 at a first side, and a second ancillary fin structure 210 may also be provided and may contact base fin structure 110 at a second side, the second side being opposite the first side thereof. The material may also be provided over the second ancillary fin structure 210, so that the second ancillary fin structure 210 contacting base fin structure 110 may further increase the volume of material grown over base fin structure 110 near the contact between base fin structure 110 and second ancillary fin structure 210 to form raised contact structure 260.

In another embodiment, forming raised contact structure 260 may facilitate minimizing the size of a contact interface 240 between raised fin structure 230 and at least one gate structure 120. Growing the material over base fin structure 110 and at least one ancillary fin structure 210 may include growing the material for a time T to form raised fin structure 230 and raised contact structure 260 so that raised contact structure 260 is formed to a height H, which height may be the designed or desired height H for a source/drain fin structure. Growing the material over base fin structure 110 may also form a contact interface between raised fin structure 230 and at least one gate structure 120. As described above, a size of the contact interface may be dependent on the time T of the growing of the material. As the at least one ancillary fin structure 210 increases the volume of material grown near the contact between at least one ancillary fin structure 210 and base fin structure 110, growing the material over at least one ancillary fin structure 210 may minimize the time needed to form raised contact structure 260 to the desired height H, thus minimizing the time T of growing the material. As described above, minimizing the time T of growing the material over base fin structure 110 to form raised fin structure 230 may minimize the height of raised fin structure 230 near gate structure 120 and further minimize the size of the contact interface 240 between raised fin structure 230 and gate structure 120. Minimizing the size of contact area 240 between raised fin structure 230 and at least one gate structure 120 may advantageously minimize a parasitic capacitance between raised fin structure 230 and at least one gate structure 120.

Figure 2D:
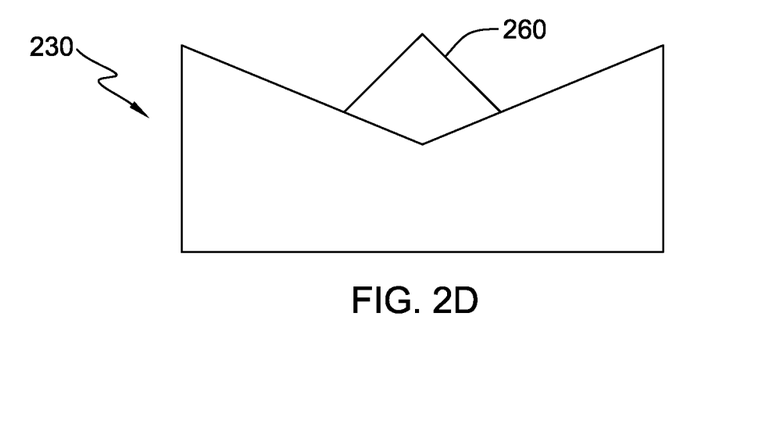
FIGS. 2D-2E depict one embodiment of a cross-sectional profile of a raised fin structure including a raised contact structure that may be formed by the process depicted in FIGS. 2A-2C, in accordance with one or more aspects of the present invention.
Figure 2E:
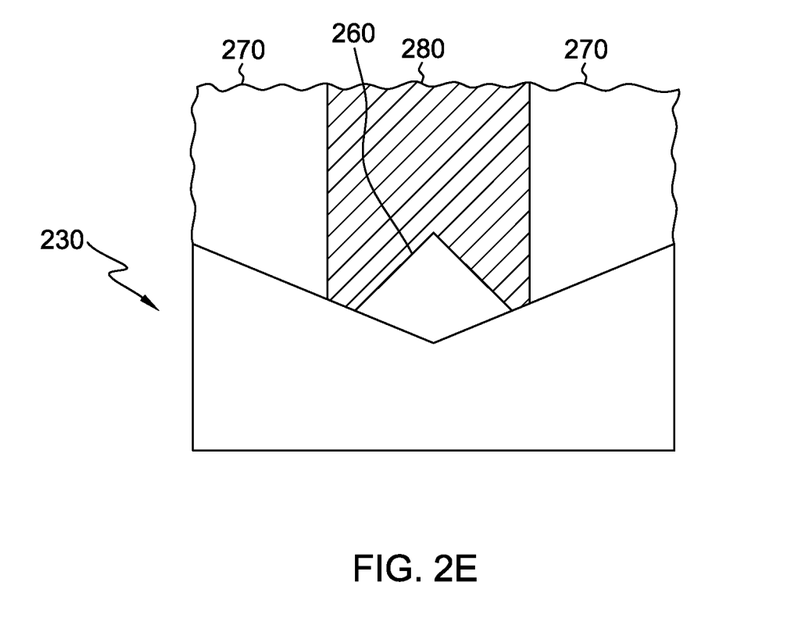

FIGS. 2D and 2E illustrate further advantages that may be realized through forming raised contact structure 260 on raised fin structure 230 as described above. FIG. 2D depicts one embodiment of at least a portion of raised fin structure 230 of FIG. 2C in cross-section profile along the length of raised fin structure 230. FIG. 2D also depicts raised contact structure 260 on raised fin structure 230 over the center 255 in cross-section, illustrating the upper surface of raised contact structure 260 having a convex shape. FIG. 2E illustrates raised fin structure 230 and raised contact structure 260 following a process, such as a silicidation process, in which a conductive contact 280 is provided over raised contact structure 260. The process may include, as for example in a silicidation process, providing an oxide material 270 over raised fin structure 230 and raised contact structure 260. A portion of oxide material 270 may be etched from over raised contact structure 260. The convex shape of the upper surface of raised contact structure 260 may prevent incomplete removal of oxide material 270 from over raised contact structure 260, as a convex shape may, for example, facilitate etch cleaning and oxide material 270 removal from over raised contact structure 260. Conductive contact 280 may then be provided over raised contact structure 260, forming a contact interface between conductive contact 280 and raised contact structure 260. As there may be no remaining oxide material 270 over raised contact structure 260, a size of the contact interface between conductive contact 280 and raised contact structure 260 may be maximized, as compared to a size of the contact interface illustrated in FIG. 1E. As well, the convex shape of the upper surface of raised contact structure 260 may provide a greater surface area over which conductive contact 280 may contact raised fin structure 260 at the contact interface, as compared to the concave-shaped raised fin structure 130. The increased surface area of the contact interface between conductive contact 280 and raised contact structure 260 may advantageously reduce a parasitic resistance between conductive contact 280 and raised contact structure 260.

Figure 3A:
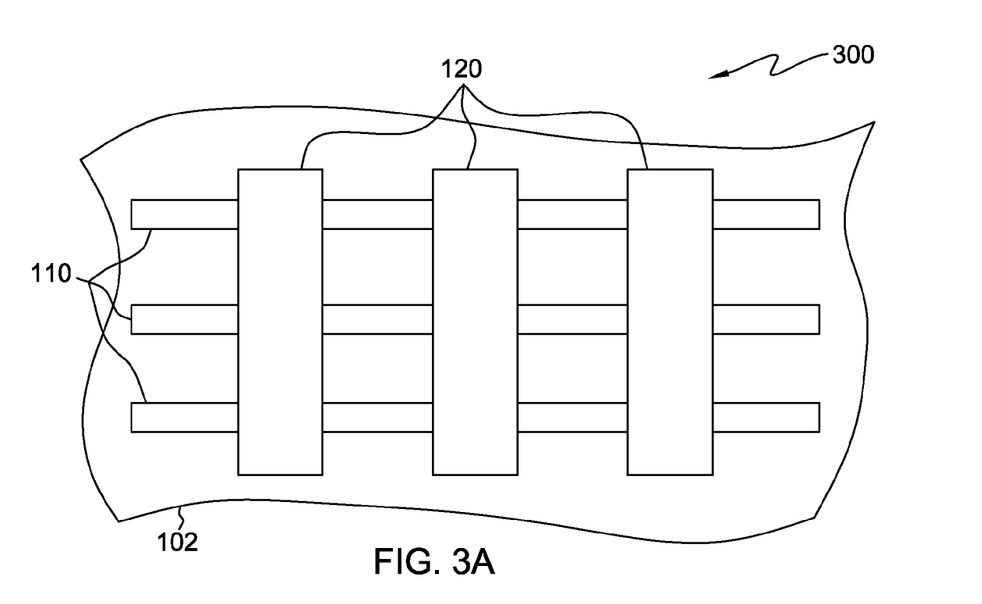
FIGS. 3A-3B depict a top-down view of one embodiment of a portion of a circuit structure, illustrating one example of a circuit structure modified by the use of ancillary fin structures, in accordance with one or more aspects of the present invention; and, FIG. 4 depicts the circuit structure of FIG. 3B with additional ancillary fin structures added below one or more gate structures, in accordance with one or more aspects of the present invention.
Figure 3B:
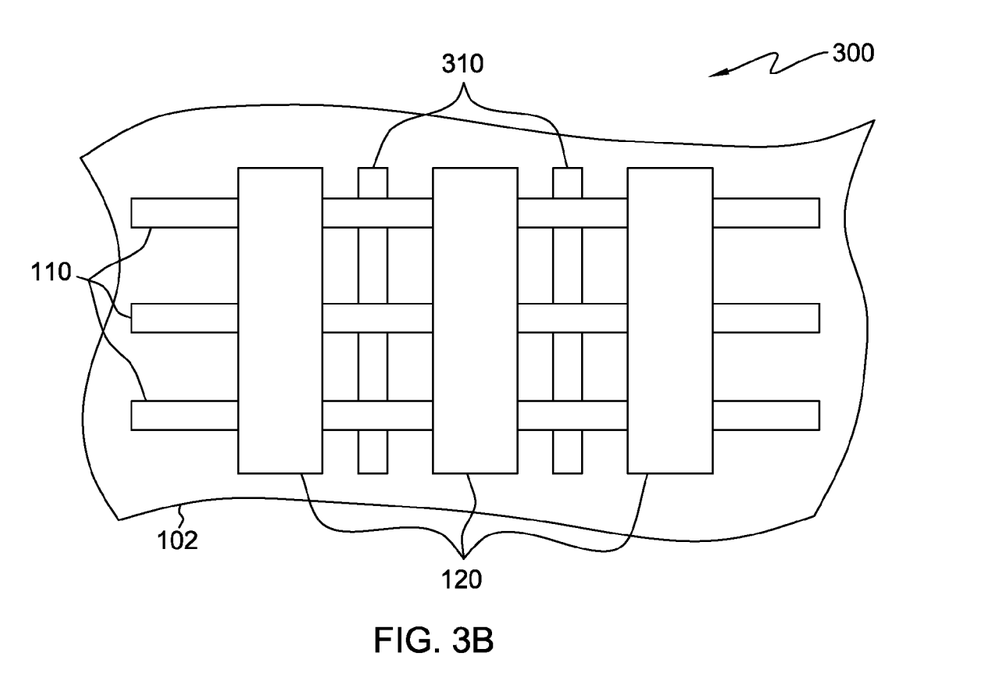

FIG. 3A depicts, by way of example, an embodiment of at least a portion of a circuit structure 300 including three gate structures 120 and three base fin structures 110. Base fin structures 110 may be configured in a parallel relation, as depicted in FIG. 3A, and any one of gate structures 120 may extend transversely over one or more of the base fin structures 110, as also depicted in FIG. 3A. Circuit structure 300 of FIG. 3A may be an example embodiment of three-gate circuit structure, as may be included in an integrated circuit without the use of ancillary fins. It will be understood that the three-gate circuit structure illustrated by circuit structure 300 is provided by way of example only; in alternative embodiments, circuit structure 300 may be a one-gate circuit structure, a two-gate circuit structure, a four-gate circuit structure, and so on. In other examples, one or more of gate structures 120 may be one or more ancillary gate structures included in circuit structure 300 to minimize undesirable circuit structure defects, such as layout-induced loading effects. FIG. 3B depicts circuit structure 300 with ancillary fins 310 contacting base fin structures 110. Ancillary fins 310 may be similar to the at least one ancillary fin 210 described above and depicted in FIGS. 2A-2C. As FIG. 3B illustrates, any one or more ancillary fin structures 310 may be provided so as to contact both a first base fin structure 110, at a side of the first base fin structure, and a second base fin structure 110, at a side of the second base fin structure. Ancillary fin structure 310 may, in one example, perpendicularly contact either or both of first base fin structure 110 and second base fin structure 110. Through contacting both the first and second base fin structures, ancillary fin structure 310 may not only increase material growth over the first base fin structure but also increase material growth over the second base fin structure, thus facilitating formation of a first raised fin structure over first base fin structure 110 and a second raised fin structure over second base fin structure 110.

Figure 4:
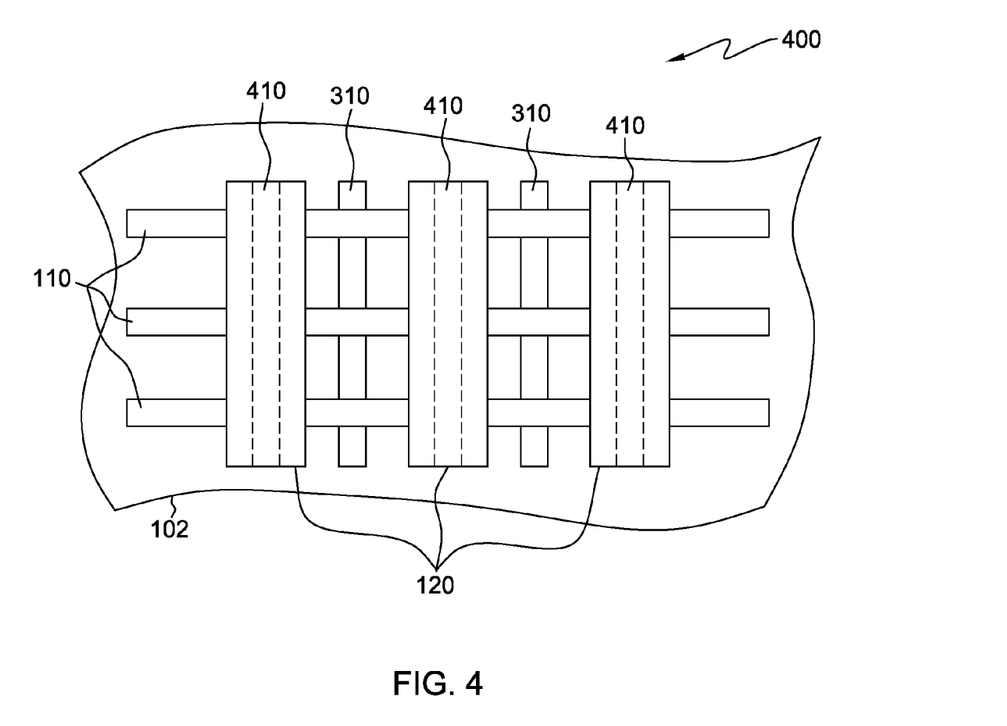

FIG. 4 depicts an embodiment of at least a portion of a circuit structure 400, similar to circuit structure 300 of FIG. 3B, in which ancillary fin structures 310 may be primary ancillary fin structures, and in which at least one secondary fin structure 410 may be provided below (depicted by dashed lines) at least one gate structure 120. As described above and as depicted by FIGS. 2A-2C and 3B, primary ancillary fin structures 310 may be provided to facilitate formation of raised fin structures over base fin structures 110. The at least one secondary ancillary fin structure 410 may be provided prior to providing the at least one gate structure 120 over base fin structures 110. The at least one secondary ancillary fin structure 410 may be provided at the same time as primary fin structures 310 or may be provided in a separate process. The at least one secondary ancillary fin structure 410 may be in contact with at least one base fin structure 110 at a side of base fin structure 110, similar to primary fin structures 310. Providing the at least one secondary ancillary fin structure 410 below the at least one gate structure 120 and in contact with at least one base fin structure 110 may minimize a channel resistance in the at least one gate structure 120. In one example, at least one gate structure 120 may be designed to operate at low voltage. Minimization of the channel resistance in at least one gate structure 120 by at least one secondary ancillary fin structure 410 may facilitate low voltage operation of the at least one gate structure 120, and may further facilitate minimizing current leakage through the at least one gate structure 120 during low voltage operation. Minimization of channel resistance in at least one gate structure 120 may also increase drive current. A secondary ancillary fin structure may also be biased, for example by a transistor structure (not depicted in FIG. 4), which may allow the at least one secondary ancillary fin structure 410 to facilitate activation and de-activation of the at least one gate structure 120.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
    fabricating a raised fin structure, the raised fin structure comprising a raised contact structure, comprising:
        providing a base fin structure;
        providing at least one ancillary fin structure, the at least one ancillary fin structure contacting from the base fin structure at a side of the base fin structure;
        growing a material over the base fin structure to form the raised fin structure;
        growing the material over the at least one ancillary fin structure, wherein the at least one ancillary fin structure contacting the base fin structure increases a volume of material grown over the base fin structure near the contact between the base fin structure and the at least one ancillary fin structure to form the raised contact structure; and
        wherein providing the conductive contact comprises a silicidation process, wherein the silicidation process comprises at least providing an oxide material over the raised fin structure and etching to remove a portion of the oxide material from over at least the raised contact structure, wherein a convex shape of the raised contact structure facilitates preventing incomplete removal of the portion of the oxide material.

2. The method of claim 1, wherein the convex shape comprises a pyramid shape.

3. The method of claim 1, further comprising providing a conductive contact over the raised contact structure to form a contact interface between the upper surface of the raised contact structure and the conductive contact, wherein the convex shape of the upper surface facilitates maximizing a surface area of the contact interface between the upper surface of the raised contact structure and the conductive contact.

4. The method of claim 1, wherein the base fin structure comprises a base material and the at least one ancillary fin structure comprises the base material, and wherein the material grown over the base fin structure and the at least one ancillary fin structure is different from the base material.

5. The method of claim 1, wherein the base fin structure comprises a first base material and the at least one ancillary fin structure comprises a second base material, and wherein the material grown over the base fin structure and the at least one ancillary fin structure is different from the first base material and the second base material.

6. The method of claim 1, wherein the material comprises one or more of silicon-phosphorous, silicon-boron, silicon carbide, silicon-germanium, or a column III-V material.

7. The method of claim 1, wherein growing the material comprises epitaxially growing the material.

8. The method of claim 1, wherein the at least one ancillary fin structure perpendicularly contacts a side of the base fin structure.

9. The method of claim 1, wherein the at least one ancillary fin structure comprises a first ancillary fin structure contacting the base fin structure at a first side of the base fin structure, and the method further comprises:
    providing a second ancillary fin structure, the second ancillary fin structure contacting the base fin structure at a second side of the base fin structure, the second side of the base fin structure being opposite to the first side thereof; and, growing the material over the second ancillary fin structure, wherein the second ancillary fin contacting the base fin structure further increases the volume of material grown over the base fin structure near the contact between the base fin structure and second ancillary fin structure to form the raised contact structure.

10. The method of claim 9, wherein the first ancillary fin structure and the second ancillary fin structure are separated by the base fin structure.

11. The method of claim 1, wherein the base fin structure is a first base fin structure and the raised fin structure is a first raised fin structure, and the method further comprises:
providing a second base fin structure, the at least one ancillary fin structure further contacting the second base fin structure at a side of the second base fin structure; and,
growing the material over the second base fin structure to form a second raised fin structure, wherein the at least one ancillary fin structure contacting the second base fin structure further increases a volume of material grown over the second base fin structure near the contact between the second base fin structure and the at least one ancillary fin structure to form a second raised contact structure on the second raised fin structure.

12. The method of claim 1, wherein the fabricating further comprises providing at least one gate structure, the at least one gate structure extending transversely over the base fin structure.

13. The method of claim 12, wherein growing the material further comprises growing the material for a time T to form the raised contact structure to a height H, wherein growing the material for the time T over the base fin structure further forms a contact interface between the raised fin structure and the at least one gate structure, wherein a size of contact interface is dependent on time T, and wherein growing the material over the at least one ancillary fin structure facilitates minimizing the time T for forming the raised contact structure to the height H to further minimize the size of the contact interface.

14. The method of claim 12, wherein the at least one gate structure comprises a first gate structure, and the method further comprises providing a second gate structure extending transversely over the base fin structure, wherein the at least one ancillary fin structure contacts the base fin structure intermediate the first gate structure and the second gate structure extending transversely over the base fin structure.

15. The method of claim 12, wherein the at least one ancillary fin structure comprises a primary ancillary fin structure, and the fabricating further comprises providing a secondary ancillary fin structure, the secondary ancillary fin structure also contacting the base fin structure at a side of the base fin structure, and wherein the at least one gate structure is provided over the secondary ancillary fin structure.

16. The method of claim 15, wherein the secondary ancillary fin structure contacting the base fin structure facilitates minimizing a channel resistance of the at least one gate structure and further facilitates increasing drive current.

17. The method of claim 15, wherein the at least one secondary ancillary fin structure facilitates activation and de-activation of the at least one gate structure.

18. The method of claim 15, wherein the at least one gate structure is designed to be operated at a low voltage, and wherein the at least one secondary ancillary fin structure facilitates minimizing current leakage when the at least one gate structure is operated at the low voltage.

19. A method comprising:
fabricating a raised fin structure, the raised fin structure comprising a raised contact structure, comprising:
providing a base fin structure;
providing at least one ancillary fin structure, the at least one ancillary fin structure contacting the base fin structure at a side of the base fin structure;
growing a material over the base fin structure to form the raised fin structure;
growing the material over the at least one ancillary fin structure, wherein the at least one ancillary fin structure contacting the base fin structure increases a volume of material grown over the base fin structure near the contact between the base fin structure and the at least one ancillary fin structure to form the raised contact structure;
wherein the fabricating further comprises providing at least one gate structure, the at least one gate structure extending transversely over the base fin structure; and
wherein growing the material further comprises growing the material for a time T to form the raised contact structure to a height H, wherein growing the material for the time T over the base fin structure further forms a contact interface between the raised fin structure and the at least one gate structure, wherein a size of contact interface is dependent on time T, and wherein growing the material over the at least one ancillary fin structure facilitates minimizing the time T for forming the raised contact structure to the height H to further minimize the size of the contact interface.

\* \* \* \* \*